United States Patent [19]

Rembold et al.

[11] Patent Number: 4,861,806
[45] Date of Patent: Aug. 29, 1989

[54] PROCESS FOR CURING POLYISOCYANATE COATINGS IN THE PRESENCE OF A FERROCENIUM COMPOUND

[75] Inventors: Manfred Rembold, Aesch; Franciszek Sitek, Therwil; Werner Rutsch, Fribourg; Godwin Berner, Binningen, all of Switzerland

[73] Assignee: Ciba-Geigy Corporation, Hawthorne, N.Y.

[21] Appl. No.: 95,726

[22] Filed: Sep. 14, 1987

[30] Foreign Application Priority Data

Sep. 19, 1986 [CH] Switzerland ................ 3755/86

[51] Int. Cl.$^4$ ............... C08G 18/08; C08G 18/18; C08G 18/16
[52] U.S. Cl. ................... 522/66; 522/174; 528/49; 528/51; 528/52; 528/56
[58] Field of Search ............ 528/56, 51, 52, 49; 522/66, 174

[56] References Cited

U.S. PATENT DOCUMENTS

| | | | |
|---|---|---|---|
| 4,076,657 | 2/1978 | Kracklauer | 524/176 |
| 4,143,002 | 3/1979 | Gill | 524/176 |
| 4,220,731 | 9/1980 | Zuppinger | 521/156 |
| 4,271,289 | 6/1981 | Homan et al. | 528/56 |
| 4,377,646 | 3/1983 | Blount | 528/51 |
| 4,421,905 | 12/1983 | Lee | 528/56 |
| 4,549,945 | 10/1985 | Lindstrom | 528/58 |
| 4,613,660 | 9/1986 | Goel et al. | 528/56 |
| 4,698,408 | 10/1987 | Goel | 528/55 |

FOREIGN PATENT DOCUMENTS

| | | |
|---|---|---|
| 94915 | 11/1983 | European Pat. Off. . |
| 109851 | 5/1984 | European Pat. Off. . |
| 152377 | 8/1985 | European Pat. Off. . |
| 0139943 | 1/1980 | Fed. Rep. of Germany . |

OTHER PUBLICATIONS

Chemical Abstract #14905y, vol. 76, 1972, Korshak, May 15, 1972.
Chemical Abstract #116025x, vol. 79, 1973, McManus, Nov. 19, 1973.
Kolesnikov et al. from Otkrytija, Izobret. Prom. Obrazets, Tovarnyk Znaki (The Open Inventor Industrial Samples and Commercial Signs, 48(31), 92, 1971, (Chem. Abstract enclosed).
Wagner-Sarx, Lackkunstharze (Synthetic Coating Resins), C. Hanser, Munich 1971, pp. 157–164.

Primary Examiner—John Kight
Assistant Examiner—Dennis R. Daley
Attorney, Agent, or Firm—Harry Falber; S. V. O'Brien

[57] ABSTRACT

Coatings of polyisocyanates, which contain a latent catalyst of the formula I $$[(R^1)Fe^{II}(R^2)]_a^+ [X]^{a-} \qquad I$$

in which a is 1, 2 or 3, $R^1$ is an uncharged carbocyclic or heterocyclic, unsubstituted or substituted aromatic ring, $R^2$ is an unsubstituted or substituted cyclopentadienyl or indenyl anion and $[X]^{a-}$ is an anion from the series comprising $F^-$, $Cl^-$, $Br^-$, $I^-$, $CN^-$, $NCO^-$, $NCS^-$, $CH_3COO^-$, $CF_3COO^-$, $SO_4^{2-}$, $PO_4^{3-}$, $NO_3^-$, $ClO_4^-$, $[(phenyl)_4B]^-$, $C_6H_5SO_3^-$, $CH_3C_6H_4SO_3^-$, $CF_3C_6H_4SO_3^-$, $CH_3SO_3^-$, $CF_3SO_3^-$, $C_4F_9SO_3^-$, $C_6F_{13}SO_3^-$, $C_8F_{17}SO_3^-$, $C_6F_5SO_3^-$, $BF_4^-$, $AlF_4^-$, $AlCl_4^-$, $TiF_6^{2-}$, $PF_6^-$, $SbF_6^-$, $SbCl_6^-$, $GeF_6^-$, $ZrF_6^{2-}$, $AsF_6^-$, $FeCl_4^-$, $SnF_6^-$, $SnCl_6^-$ or $BiCl_6^-$, can be cured by irradiation with actinic light and subsequent heating.

11 Claims, No Drawings

PROCESS FOR CURING POLYISOCYANATE COATINGS IN THE PRESENCE OF A FERROCENIUM COMPOUND

The invention relates to a process for curing coatings of polyisocyanates in the presence of latent curing catalysts from the class of ferrocenium salts, and to the cured coatings thus obtained and the coating compositions used for this purpose.

The basis of the process is that a compound which contains more than one isocyanate group is polymerized and hence converted into a crosslinked insoluble state. Polymerization proceeds by heating in the presence of a catalyst which, in a preceding stage, is formed by irradiation of a latent catalysts with actinic light. Even though the actual polymerization is a thermal/catalytic process, the process is turned by the use of a catalyst capable of photoactivation into a process which is controllable by light, and can therefore be used for image recording.

The invention relates to a process for curing polyisocyanate coatings, which comprises adding a ferrocenium compound of the formula I

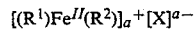

$$[(R^1)Fe^{II}(R^2)]_a{}^+[X]^{a-} \qquad I$$

in which a is 1, 2 or 3, $R^1$ is an uncharged carbocyclic or heterocyclic, unsubstituted or substituted aromatic ring, $R^2$ is an unsubstituted or substituted cyclopentadienyl or indenyl anion and $[X]^{a-}$ is an anion from the series comprising $F^-$, $Cl^-$, $Br^-$, $I^-$, $CN^-$, $NCO^-$, $NCS^-$, $CH_3COO^-$, $CF_3COO^-$, $SO_4{}^{2-}$, $CF_3C_6H_4SO_3{}^-$, $CH_3SO_3{}^-$, $CF_3SO_3{}^-$, $C_4DF_9SO_3{}^-$, $C_6F_{13}SO_3{}^-$, $C_8F_{17}SO_3$, $C_6F_5SO_3$, $BF_4$, $AlF_4$, $AlCl_4$, $TiF_6$, $PF_6$, $SbF_6$, $Sb_{Cl6}$, $GeF_6$, $ZrF_6$, $AsF_6$, $FeCl_4$, $SnF_6$, $SnCl_6$ or $BiCl_6$, as a latent curing catalyst to a polyisocyanate, applying the mixture to the substrate, irradiating the coating with actinic light and then heating it to 60°-200° C.

A polyisocyanate is to be understood as meaning an organic compound which contains more than one isocyanate group in its molecule. Preferably, an aliphatic diisocyanate or triisocyanate is used, or mixtures of such compounds. Polyisocyanates having a low vapour pressure are preferably used, in order to prevent volatilization on heating of the coating and hence any occupational hygiene problems. Such polyisocyanates of low vapour pressure have in most cases a relatively high molecular weight and can be prepared, for example, by reacting low-molecular diisocyanates with less than stoichiometric quantities of a polyol. Other examples of polyisocyanates of low vapour are the dimers or trimers of diisocyanates. Such polyisocyanates of relatively high molecular weight are also termed polyisocyanate prepolymers. Various products of this type are commercially available and are used especially for the preparation of polyurethane coatings. A review of such products is to be found, for example, in Wagner-Sarx, Lackkunstharze [Synthetic coating resins], published by C. Hanser, Munich 1971, pages 157-164.

Minor quantities of a monoisocyanate can also be admixed to the polyisocyanate or polyisocyanate mixture. These monoisocyanates are chemically incorporated (copolymerized) into the crosslinked product and can therefore be used, for example, as reactive diluents or for modifying the physical properties of the resin. Preferably not more than 30% by weight of monoisocyanate, relative to the polyisocyanate, are used.

The compounds of the formula I, used as the latent curing catalysts, are salt-type derivatives of ferrocene. In the formula I, $R^1$ is an uncharged π-arene and can be a heterocyclic or carbocyclic arene. Preferably, $R^1$ is a carbocyclic arene. Examples of heterocyclic arenes and their substitution produces are 5- or 6-membered heteroaromatics containing O, N and/or S atoms, and fused derivatives and alkyl derivatives thereof, for example thiophene, chromene, xanthene, thioxanthene, benzothiophene, naphthothiophene, thianthrene, diphenylene oxide, diphenylene sulfide, methylxanthene, isopropylthioxanthene, 3-methylbenzothiophene, pyridine, quinoline, quinaldine, isoquinoline, carbazole, N-methylcarbazole, acridine, phenazine or N-ethylphenothiazine. Examples of unsubstituted carbocyclic arenes are especially benzene, naphthalene, indene, fluorine, pyrene, phenanthrene, anthracene, 9,10-dihydroanthracene, tetrahydronaphthalene, naphthacene, coronene, biphenylene or triphenylene. Examples of substituted carbocyclic arenes are especially benzene, naphthalene or anthracene which are substituted by $C_1$-$C_{14}$-alkyl, halogen, phenyl, $C_1$-$C_{10}$-alkoxy, cyano, $C_7$-$C_{12}$-alkylphenyl, $C_7$-$C_{11}$-phenylalkyl, $C_8$-$C_{18}$-alkylphenylalkyl, $C_2$-$C_{13}$-alkoxycarbonyl, phenoxy, phenylthio, phenoxycarbonyl, styryl, $C_1$-$C_4$-alkylstyryl or $C_1$-$C_4$alkoxystyryl. Examples of these are toluene, xylene, ethylbenzene, cumene, tert.butylbenzene, methylnaphthalene, methoxybenzene, ethoxybenzene, dimethoxybenzene, chlorobenzene, bromobenzene, dichlorobenzene, chloronaphthalene, bromonaphthalene, benzonitrile, methyl or dodecyl benzoate, diphenyl ether, diphenyl sulfide, stilbene, 4,4'-dimethylstilbene, 4,4'-dimethoxystilbene, 9-benzylanthracene or 9-(4-butylbenzyl-anthracene.

Preferably, $R^1$ is benzene, toluene, xylene, cumene, methoxybenzene, chlorobenzene, 4-chlorotoluene, naphthalene, methylnaphthalene, chloronaphthalene, methoxynaphthalene, diphenyl, indene, pyrene, diphenylene sulfide, diphenylene ether, stilbene or 9-(4-butylbenzyl)-anthracene, and with particular preference toluene, xylene, cumene or 4-chlorotoluene.

A substituted cyclopentadienyl or indenyl anion $R^2$ can especially be a cyclopentadienyl or indenyl anion which is substituted by $C_1$-$C_8$-alkyl, $C_2$-$C_5$-alkanoyl, $C_2$-$C_6$-alkoxycarbonyl, cyano or phenyl. Examples of these are the anions of methyl-, ethyl, n-propyl-, isopropyl-, n-butyl-, tert.butyl-, n-hexyl- or n-octyl-cyclopentadiene, methyl-, ethyl- or isopropyl-indene, dimethylcyclopentadiene, acetyl-, propionyl- or butyrylcyclopentadiene, methyl or ethyl cyclopentadienecarboxylate or cyanoinidene. Preferably, $R^2$ is a cyclopentadienyl or ($C_1$-$C_4$-alkyl)-cyclopentadienyl anion.

The anion $[X]^{a-}$ is preferably a monovalent anion, especially an anion from the series $BF_4$, $PF_6$, $SbF_6$, $AsF_6$, $CF_3SO_3$, $C_4F_9SO_3$, $C_8F_{17}SO_3$ or $CF_3COO$.

The following are examples of compounds which can be used according to the invention as latent curing catalysts: ($\eta^6$-benzene)($\eta^5$-cyclopentadienyl)-iron(II) hexafluorophospate, ($\eta^6$-toluene)($\eta^5$-indenyl)-iron(II) hexafluorophosphate, ($\eta^6$-toluene)($\eta^n5$-cyclopentadienyl)-iron(II) tetrafluoroborate, ($\eta^6$-toluene)($\eta^{5-cyclopentadienyl}$)iron(II) hexafluoroantimonate, ($\eta^6$-ethylbenzene)($\eta^5$-cyclopentadienyl)-iron(II) hexafluoroantimonate, ($\eta^6$cumene)($\eta^5$-cyclopentadienyl)-iron(II) hexafluorophosphate, ($\eta^6$cumene)($\eta^5$-cyclopentadienyl)-iron(II) hexafluoroantimonate, ($\eta^6$-cumene)($\eta^5$-methylcyclopentadienyl)-iron(II) hexafluoroaresenate, ($\eta^6$-cumene)($\eta^5$- methylcyclopentadienyl)-iron(II)tetrafluoborate, ($\eta^6$-cumene)($\eta^5$-indenyl)-iron(II) tetrafluoroborate, ($\eta^6$-xylene)($\eta^5$-cyclopentadienyl)-iron(II)perchlorate, ($\eta^6$-mesitylene)($\eta^5$-cyclopentadienyl)-iron(II)hexafluorophosphate, ($\eta^6$-methoxybenzene)($\eta^5$-cyclopentadienyl)iron(II) hexafluoroantimonate, ($\eta^6$-chlorotoluene)($\eta^5$-cyclopentadienyl)-iron(II) hexafluorophosphate, ($\eta^6$-naphthtalene)($^5$-cyclopentadienyl)-iron(II) hexafluorophosphate, ($\eta^6$-naphthalene)($\eta^5$-cyclopentadienyl)-iron(II) hexafluoroantimonate, ($\eta^6$-1-methylnaphthalene)($\eta^5$-cyclopentadienyl)-iron(II) hexafluorophosphate, ($\eta^6$-2-methylnaphthalene)($\eta^5$cyclopentadienyl)-iron(II) hexafluoroantimonate, ($\eta^6$-1-chloronaphthalene)($\eta^5$-cyclopentadienyl)-iron(II) hexafluorophosphate, ($\eta^6$-2-methoxynaphthalene)($\eta^5$cyclopentadienyl)-iron(II) hexafluoroantimonate, ($\eta^6$-diphenyl)($\eta^5$-cyclopentadienyl)-iron(II) hexafluoroarsenate, ($\eta^6$-diphenylene sulfide)($\eta$ $^5$-cyclopentadienyl)iron(II) hexafluorophospate, ($\eta^6$-pyrene)(h$^5$-cyclopentadienyl)iron(II) hexafluorophosphate, ($\eta^6$-anthracene)($\eta^5$-cyclopentadienyl)-iron(II) hexafluorophospate, ($\eta^6$-perylene)($\eta^5$-methylcyclopentadiene)-iron(II) hexafluorophosphate, ($^6$-indene)($\eta^5$-indenyl)-iron(II) hexafluorophosphate, ($\eta^6$-9,10-dihydroanthracene)($\eta^5$-cyclopentadienyl)-iron(II) hexafluoroantimonate, ($\eta^6$-stilbene)($\eta^5$-cyclopentadienyl)-iron(II) hexafluorophosphate, ($\eta^6$-9-[4-butylbenzyl]anthracene)($\eta^5$-cyclopentadienyl)iron(II) hexafluorophosphate, ($\eta^6$-cumene)($\eta^5$-cyclopentadienyl)-iron(II) acetate, ($\eta^6$-cumene)($\eta^5$-cyclopentadienyl)-iron(II) trifluoroacetate, ($\eta^6$-cumene)($\eta^5$-cyclopentadienyl)-iron(II) toluenesulfonate, ($\eta^6$-cumene)($\eta^5$-cyclopentadienyl)-iron(II) trifluoromethanesulfonate, ($\eta^6$-cumene)($\eta^5$cyclopentadienyl)-iron(II) perfluorooctanesulfonate, ($\eta^6$-2-methylnaphthalene) ($\eta^5$-cyclopentadienyl)iron(II) hexafluorophosphate, ($\eta^6$-2-methylnaphthalene)($\eta^5$cyclopentadienyl)-iron(II) trifluoromethanesulfonate and ($\eta^5$-2-methylnaphthalene)($\eta^5$cyclopentadienyl)-iron(II) perfluorooctanesulfonate.

The compounds of the formula I are known compounds or can be prepared analogously to known compounds. Thus, for example, in EP-A-94,915 and EP-A-109,851, a number of such compounds and their preparation are described. The use of these compounds as latent curing catalysts for cationically polymerizable materials, in particular for epoxide resins, is also described therein.

It was not to be expected, however, that these compounds are also latent curing catalysts for isocyanate compounds. Polyisocyanates are usually cured by reaction with a polyol or polyaine, i.e. by a two-component polyaddition and not by a polymerization of the isocyanate. Processes for cyclizing dimerization and trimerization of isocyanates are known, especially phosphines, tertiary amines or alkali metal hydroxides or alcoholates being used as the catalysts for this purpose.

The activity of the catalysts described can be enhanced by the addition of certain sensitizers, as described in EP-A-152,377. These are compounds having a triplet energy of at least 30 kcal/mol. Examples of these are compounds from the series of the thioxanthones, phthalimides, coumarins and polycyclic aromatic compounds. Thioxanthone, anthracene and derivatives thereof are particularly suitable.

The latent curing catalyst is in general used in a quantity of 0.05 to 10% by weight, preferably 0.6 to 6% by weight, relative to the polyisocyanate or polyisocyanate mixture. If a sensitizer is also added, the latter is advantageously used in a quantity of 0.05 to 5% by weight, preferably 0.1 to 1.5% by weight, relative to the polyisocyanate.

The catalysts and, if appropriate, the sensitizer can be admixed as such to the polyisocyanate. Preferably, the catalyst is dissolved in a small quantity of a solvent inert towards isocyanates, in order to accelerates the mixing process.

Other additives, such as are conventional for coatings, can also be added to the polyisocyanate at the same time. These are mainly solvents, pigments, dyes, flow aids, thixotropic agents, adhesion promoters, antistatics, lightstabilizers or antioxidants.

The polyisocyanate coating compositions which have been mixed with the latent catalyst and which can also contain further additives can be stored if light and heat are excluded. The invention therefore also relates to coating compositions of one or more polyisocyanates, containing 0.05 to 10% by weight, relative to the polyisocyanate, of a compound of the formula I as a latent curing catalyst.

Suitable substrates which can be coated according to the invention are all solid materials, for example metals, ceramics, glass plastics, rubbers, textiles, wood or paper. The coating compositions are applied, if appropriate after dilution with a solvent, to the substrate by the coating methods conventional in the art, for example by brushing, roller-application, spraying or dipping. The coating thus applied is then subjected to an irradiation with actinic light.

In particular, the irradiation apparatus types conventional in UV technology are used for irradiation. In most cases, the workpiece is transported along under one or more light sources in the apparatus. Examples of suitable light sources are xenon lamps, argon lamps, tungsten lamps, carbon arc lamps, metal halide lamps or metal are lamps, for example low-pressure, medium-pressure or high-pressure mercury lamps. The light from these lamps is rich in actinic light having wavelengths in the range from 200 to 600 nm. The irradiation times are in general between one second and one minute, preferably 5–20 seconds. Laser radiation, for example argon ion laser radiation, is also suitable for curing coatings.

After irradiation, the coating is cured by heating to 60°–100° C. The temperature depends on the substrate material and on the desired curing time. Preferably, curing is carried out at 100° to 140° C. The processes and apparatus usual in coating technology can be used for this purpose, such as infrared radiation, inductive heating and especially hot-air and oven heating.

The cured coatings thus obtained are clear hard films which are insoluble in water or organic solvents. They are therefore suitable so protective coatings for the particular substrates. The coating compositions according to the invention are particularly suitable for image recording methods. In this case, the coating is exposed imagewise, then heated and subsequently deveoped with a solvent. This gives a negative image in that colour with which the coating composition is dyed. Another important application of the process is the production of printed circuits. In this case, the coating composition according to the invention is applied to a metal layer. After exposure, curing and development, the metal can be etched away in the unexposed areas.

The examples which follow explain the process in more detail, without restricting it thereto. Unless otherwise stated, parts therein are parts by weight and percentages are percent by weight.

EXAMPLE 1

100 parts of a 90% solution of an aliphatic polyisocyanate in 1:1 butyl acetate/solvent naphtha (Desmodur ® N 3390) are mixed with a 50% solution of 5.6 parts of the latent curing catalyst K-1=($\eta^6$-cumene)($\eta^5$-cyclopentadienyl)-iron(II) hexafluorophosphate in propylene carbonate.

The mixture is applied in a thickness of 100 μm to a 200 μm thick aluminium foil and irradiated for different lengths of time (4.2 seconds, 8.4 seconds and 12.6 seconds) in an APC exposure apparatus with 2 medium-pressure Hg lamps of 80 W/cm. The samples are then cured fo 30 minutes in a circulating air-oven at 120° C. After 30 minutes, the pendulum hardness of the coatings is measured by the Koenig method (DIN 53,157). A catalyst-free coating composition is used as a comparison.

| Catalyst | Irradiation time | Pendulum hardness (seconds) after 30 minutes at 120° C. |
|---|---|---|
| none | 0 | 0 |
| 4% K-1 | 0 | 0 |
| 4% K-1 | 4.2 seconds | 140 |
| 4% K-1 | 8.2 seconds | 170 |
| 4% K-1 | 12.6 seconds | 190 |

EXAMPLE 2

The coating composition described in Example 1 (Desmodur ® N 3390 with 4% of K-1) is applied as a 100 μm layer to a 200 μm thick aluminium foil and covered by a 76 μm thick polyester film. An optical wedge with 21 transparency steps (Stouffer wedge) is placed on top of the film, and the samples are irradiated for various times (20, 40 and 60 seconds) by means of a 5 kW metal halide lamp at a distance of 30 cm.

After the cover films have been removed, the samples are heated for 20 and 30 minutes in a circulating-air oven to 120° C. The samples thus cured are washed for 30 seconds with trichloroethylene in an ultrasonic developing bath. After drying, the last step of which an image has still been formed is determined. The results are shown in the table which follows.

| Exposure time | Image step after a thermal curing time of | |
|---|---|---|
| | 20 minutes | 30 minutes |
| 20 seconds | 3 | 4 |
| 40 seconds | 5 | 7 |
| 60 seconds | 6 | 8 |

The same test is carried out using 4% of K-2 = ($\eta^6$-cumene) ($\eta^5$-cyclopentadienyl)-iron(II) trifluoromethane-sulphonate and gives the following results:

| Exposure time | Image step after a thermal curing time of | |
|---|---|---|
| | 20 minutes | 30 minutes |
| 20 seconds | 10 | 21 |
| 40 seconds | 11 | 21 |
| 60 seconds | 12 | 21 |

What is claimed is:

1. A process for curing polyisocyanate coatings, which comprises adding a ferrocenium compound of formula I $$[(R^1)Fe^{II}(R^2)]_a{}^+[X]^{a-}$$

in which a is 1, 2 or 3, $R^1$ is an uncharged carbocyclic unsubstituted aromatic ring, an uncharged carbocyclic substituted aromatic ring, an uncharged heterocyclic unsubstituted aromatic ring or an uncharged heterocyclic substituted aromatic ring $R^2$ is an unsubstituted or substituted cyclopentadienyl or indenyl anion and $[X]^{a-}$ is an anion which is $F^-$, $Cl^-$, $Br^-$, $I^-$, $CN^-$, $NCO^-$, $NCS^-$, $CH_3COO^-$, $CF_3COO^-$, $SO_4{}^{2-}$, $PO_4{}^{3-}$, $NO_3{}^-$, $ClO_4{}^-$, $[(phenyl)_4B]^-$, $C_6H_5SO_3{}^-$, $CH_3C_6H_4SO_3{}^-$ $CF_3C_6H_4SO_3{}^-$, $CH_3SO_3{}^-$, $CF_3SO_3{}^-$, $C_4F_9SO_3{}^-$, $C_6F_{13}SO_3{}^-$, $C_8F_{17}SO_3{}^-$, $C_6F_5SO_3{}^-$, $BF_4{}^-$, $AlF_4{}^-$, $AlCl_4{}^-$, $TiF_6{}^-$, $PF_6{}^-$, $SbF_6{}^-$, $SbCl_6{}^-$, $GeF_6{}^-$, $AsF_6{}^-$, $FeCl_4{}^-$, $SnF_6{}^-$, $SnCl_6{}^-$, or $BiCl_6{}^-$, as a latent curing catalyst to at least one polyisocyanate, applying the resulting mixture to a substrate as a coating, irradiating the coating with actinic light and then heating to 60°–200° C.

2. A process according to claim 1, wherein the polyisocyanate comprises a mixture of polyisocyanates.

3. A process according to claim 1, wherein the polyisocyanate comprises a mixture of an aliphatic diisocyanate or triisocyanate.

4. A process according to claim 1, wherein a minor quantity of a monoisocyanate is added to the polyisocyanate.

5. A process according to claim 1, wherein 0.05 to 10% by weight, relative to the polyisocyanate, of the curing catalyst of the formula I is added.

6. A process according to claim 1, wherein the catalyst added is a compound of the formula I, in which $R^1$ is benzene, toluene, xylene, cumene, methoxybenzene, chlorobenzene, 4-chlorotoluene, naphthalene, methylnaphthalene, chloronaphthalene, methoxynaphthalene, diphenyl, indene, pyrene, diphenylene sulfide, diphenyl ether, stilbene or 9-(4-butylbenzyl)-anthracene.

7. A process according to claim 1, wherein the catalyst added is a compound of the formula I, in which $R^1$ is toluene, xylene, cumene or 4-chlorotoluene.

8. A process according to claim 1, wherein the catalyst added is a compound of the formula I, in which $R^2$ is a cyclopentadienyl or ($C_1$–$C_4$-alkyl)-cyclopentadienyl anion.

9. A process according to claim 1, wherein the catalyst added is a compound of the formula I, in which a is 1 and $X^-$ is an anion from the series $BF_4$, $PF_6$, $SbF_6$, $AsF_6$, $CF_3SO_3$, $C_4DF_9SO_3$, $C_8F_{17}SO_3$ or $CF_3COO^-$.

10. A process according to claim 16, wherein wavelength of the actinic light is 200–600 nm.

11. A coating, obtained by curing a polyisocyanate according to the process of claim 1.

* * * * *